United States Patent
Kim et al.

(10) Patent No.: US 11,264,076 B2
(45) Date of Patent: Mar. 1, 2022

(54) POWER CONTROL CIRCUIT, SEMICONDUCTOR APPARATUS INCLUDING THE SAME AND POWER CONTROL METHOD OF SEMICONDUCTOR APPARATUS

(71) Applicant: SK hynix Inc., Gyeonggi-do (KR)

(72) Inventors: Woongrae Kim, Gyeonggi-do (KR); Byeong Cheol Lee, Seoul (KR); Se Won Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 16/661,342

(22) Filed: Oct. 23, 2019

(65) Prior Publication Data
US 2020/0211616 A1    Jul. 2, 2020

(30) Foreign Application Priority Data
Jan. 2, 2019   (KR) .................. 10-2019-0000372

(51) Int. Cl.
*G11C 11/406*   (2006.01)
*G11C 11/4074*  (2006.01)
*G11C 8/10*     (2006.01)

(52) U.S. Cl.
CPC ............ *G11C 11/4074* (2013.01); *G11C 8/10* (2013.01); *G11C 11/406* (2013.01)

(58) Field of Classification Search
CPC ..... G11C 11/4074; G11C 11/406; G11C 8/10; G11C 11/40611; G11C 2207/2227; G11C 2211/4067; G11C 5/145; G11C 7/1006; G11C 5/144; G06F 1/3206; G06F 1/3296; G06F 1/3225

See application file for complete search history.

(56) References Cited

U.S. PATENT DOCUMENTS

| | | | |
|---|---|---|---|
| 6,038,186 A | 3/2000 | Tanizaki | |
| 6,199,139 B1* | 3/2001 | Katayama | G11C 11/406 |
| | | | 711/106 |
| 6,411,157 B1* | 6/2002 | Hsu | G11C 11/406 |
| | | | 327/534 |
| 2004/0027888 A1* | 2/2004 | Kurita | G11C 11/406 |
| | | | 365/202 |
| 2009/0129505 A1* | 5/2009 | Ware | G11C 8/18 |
| | | | 375/316 |
| 2019/0165767 A1* | 5/2019 | Kim | H03K 17/687 |

FOREIGN PATENT DOCUMENTS

KR     1020140116650     10/2014

* cited by examiner

*Primary Examiner* — Jay W. Radke
(74) *Attorney, Agent, or Firm* — IP & T Group LLP

(57) ABSTRACT

A power control circuit includes a power control signal generation circuit configured to generate a voltage control signal according to a deep sleep command for operating a semiconductor apparatus in a deep sleep mode; a voltage divider circuit having a division ratio that is changed according to the voltage control signal, and configured to generate a divided voltage by dividing an internal voltage at the changed division ratio; a comparator configured to generate a detection signal by comparing a reference voltage to the divided voltage; an oscillator configured to generate an oscillation signal according to the detection signal; and a pump configured to generate the internal voltage according to the oscillation signal.

16 Claims, 9 Drawing Sheets

POWER CONTROL CIRCUIT, SEMICONDUCTOR APPARATUS INCLUDING THE SAME AND POWER CONTROL METHOD OF SEMICONDUCTOR APPARATUS

CROSS-REFERENCES TO RELATED APPLICATION

The present application claims priority under 35 U.S.C. § 119(a) to Korean application number 10-2019-0000372, filed on Jan. 2, 2019, which is incorporated herein by reference in its entirety.

BACKGROUND

1. Technical Field

Various embodiments generally relate to a semiconductor circuit, and more particularly, to a power control circuit, a semiconductor apparatus including the same and a power control method of the semiconductor apparatus.

2. Related Art

Recently, electronic devices, for example, portable electronic devices have been reduced in size and weight.

In particular, since the portable electronic device is operated by limited power, i.e. a battery, power consumption of the portable electronic device needs to be reduced.

The portable electronic device may operate in a power down mode to reduce the power consumption.

The power down mode may include a normal power down mode and a deep sleep mode (or deep power down mode).

The deep sleep mode needs to guarantee a longer power down interval than the normal power down mode.

The portable electronic device employs a power gating technique for preventing unnecessary power supply to function blocks in the power down mode.

The portable electronic device may necessarily include a semiconductor memory apparatus in order to perform the natural function thereof, to store data, and to perform an application program.

When the semiconductor memory apparatus includes volatile memory cells each composed of one transistor and one capacitor, data is stored in the capacitor.

Since a leakage current occurs due to the characteristic of the capacitor, the semiconductor memory apparatus performs a refresh operation of rewriting the data stored in the memory cell at each predetermined time, in order to retain the data stored in the memory cell for a long time.

Refresh operations may be classified as an auto refresh operation and a self refresh operation.

The auto refresh operation may be performed according to a command from a host, for example, a memory controller.

The self refresh operation may be performed by the semiconductor memory device itself. For example, the self refresh operation may be performed during the deep sleep mode.

SUMMARY

Various embodiments are directed to a power control circuit capable of reducing power consumption, a semiconductor apparatus including the same, and a power control method of a semiconductor apparatus.

In an embodiment, a power control circuit may include: a power control signal generation circuit configured to generate a voltage control signal according to a deep sleep command for operating a semiconductor apparatus in a deep sleep mode; a voltage divider circuit having a division ratio that is changed according to the voltage control signal, and configured to generate a divided voltage by dividing an internal voltage at the changed division ratio; a comparator configured to generate a detection signal by comparing a reference voltage to the divided voltage; an oscillator configured to generate an oscillation signal according to the detection signal; and a pump configured to generate the internal voltage according to the oscillation signal.

In an embodiment, a semiconductor apparatus may include: a memory region; a refresh control circuit configured to perform a refresh operation on the memory region using an internal voltage, according to a refresh command; and a power control circuit configured to adjust the level of the internal voltage to a second level during a deep sleep mode interval, the second level being lower than a first level which is set for operation intervals other than the deep sleep mode interval.

In an embodiment, a power control method of a semiconductor apparatus may include the steps of: generating an internal voltage at a first level when the semiconductor apparatus enters a normal power down mode; generating the internal voltage at a second level lower than the first level when the semiconductor apparatus enters a deep sleep mode; and raising the level of the internal voltage to the first level from the second level when the semiconductor apparatus exits from the deep sleep mode.

DETAILED DESCRIPTION

Hereinafter, a power control circuit, a semiconductor apparatus including the same, and a power control method of the semiconductor apparatus according to the present disclosure is described below with reference to the accompanying drawings through exemplary embodiments.

The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

It should also be understood that a feature described with an embodiment may be employed with one or more features of other embodiments without departing from the scope of the present invention.

In describing the invention, features which are well-known in the art are omitted for avoiding obscuring the described invention.

Figure 1:
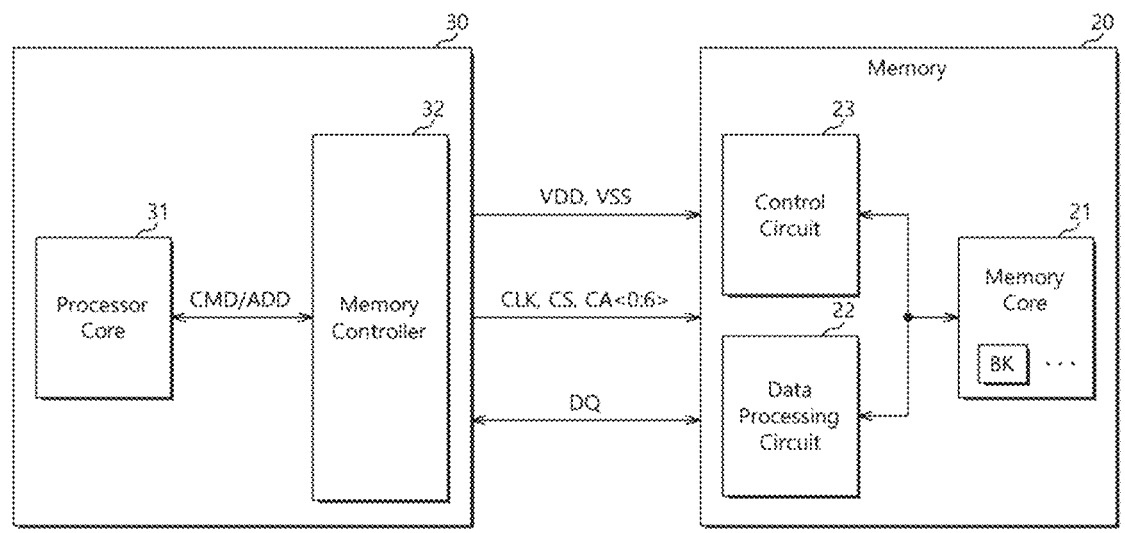
FIG. 1 is a diagram illustrating a configuration of an electronic system in accordance with an embodiment.

FIG. 1 is a diagram illustrating a configuration of an electronic system 10 in accordance with an embodiment.

Referring to FIG. 1, the electronic system 10 in accordance with the present embodiment may include a memory 20 and a processor 30.

The electronic system 10 may be configured in the form of SoC (System on Chip).

The processor 30 may include a central processing unit (CPU) or a graphic processing unit (GPU).

The processor 30 may include a processor core 31 and a memory controller 32.

The processor core 31 may provide the memory controller 32 with various commands CMD and addresses ADD for controlling the memory 20.

The memory controller 32 may provide the memory 20 with a first supply voltage VDD, a first ground voltage VSS, a chip select signal CS and a command/address signal CA<0:N> according to the commands CMD and addresses ADD provided from the processor core 31, in order to control the memory 20.

The memory controller 32 may transfer/receive data DQ to/from the memory 20.

The memory 20 may lower the level of an internal voltage, for example, a voltage used for a refresh operation during a deep sleep mode interval, thereby reducing power consumption.

During the deep sleep mode interval, the memory 20 may lower the level of the internal voltage, and increase an active operation interval.

The memory 20 may include a memory core 21, a data processing circuit 22, and a control circuit 23.

The memory core 21 may include a plurality of unit memory regions, for example, memory banks BK and circuit components for data input/output of the memory banks BK.

The data processing circuit 22 may perform a data input/output-related operation between the memory core 21 and the memory controller 32.

The control circuit 23 may control a data read/write operation and a power gating-related operation of the memory 20 according to the chip select signal CS and the command/address signal CA<0:N> which are provided from the memory controller 32 of the processor 30.

Figure 2:
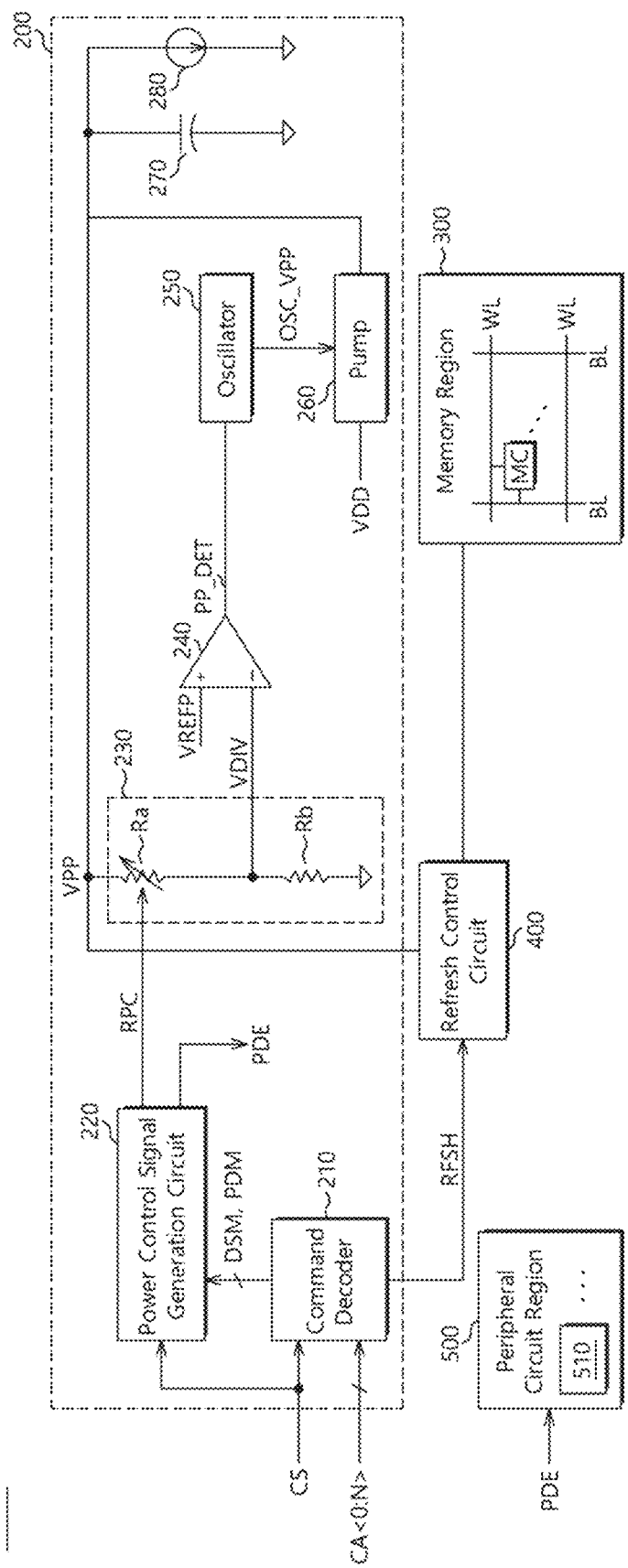
FIG. 2 is a diagram illustrating a configuration of a semiconductor apparatus in accordance with an embodiment.

FIG. 2 is a diagram illustrating a configuration of the semiconductor apparatus 100 in accordance with the present embodiment.

The semiconductor apparatus 100 in accordance with the present embodiment may be included in the memory 20 of FIG. 1.

The semiconductor apparatus 100 in accordance with the present embodiment may lower the level of an internal voltage, for example, a pumping voltage VPP used for the refresh operation during the deep sleep mode interval, thereby reducing power consumption.

Referring to FIG. 2, the semiconductor apparatus 100 in accordance with the present embodiment may include a power control circuit 200, a memory region 300, a refresh control circuit 400 and a peripheral circuit region 500.

The memory region 300 may include a plurality of word lines WL, a plurality of bit lines BL and a plurality of memory cells MC.

Each of the memory cells MC may be coupled to a word line WL and a bit line BL.

The memory region 300 may include a plurality of unit memory blocks, for example, a plurality of memory banks.

Each of the memory banks may include a plurality of memory cells MC.

The memory region 300 may further include input/output-related circuit components for reading data of the memory cells MC or storing data in the memory cells MC.

The refresh control circuit 400 may perform a refresh operation on the memory region 300 using the pumping voltage VPP, according to a refresh command RFSH.

The refresh operation may include an operation of sensing and amplifying data stored in the memory cells MC through a row active operation, and then storing the amplified data in the memory cells MC again.

The peripheral circuit region 500 may include circuit components for transferring data inputted from the outside of the semiconductor apparatus 100 to the memory region 300 or transferring data outputted from the memory region 300 to the outside of the semiconductor apparatus 100.

The peripheral circuit region 500 may include a plurality of logic circuit blocks 510 each having a plurality of logic gates.

The plurality of logic circuit blocks 510 may perform a power gating operation which stops supplying power supply to one or more of the logic gates according to a power gating control signal PDE.

During the deep sleep mode interval, the power control circuit 200 may adjust the level of an internal voltage, for example, the pumping voltage used for the refresh operation to a lower level than a target level in the other mode intervals except the deep sleep mode interval.

Hereafter, the target level of the pumping voltage VPP in the other mode intervals except the deep sleep mode interval may be referred to as a first level, and the target level in the deep sleep mode interval may be referred to as a second level.

The power control circuit 200 may recognize an entry into the deep sleep mode according to the chip select signal CS and the command/address signal CA<0:N>.

The power control circuit 200 may include a command decoder 210, a power control signal generation circuit 220, a voltage divider circuit 230, a comparator 240, an oscillator 250 and a pump 260.

The power control circuit 200 may further include a pumping voltage capacitor 270 and a current path 280.

The command decoder 210 may generate various commands including the refresh command RFSH, a normal power down command PDM, and a deep sleep command DSM by decoding the chip select signal CS and the command/address signal CA<0:N>.

The power control signal generation circuit 220 may generate the power gating control signal PDE and a voltage control signal RPC according to the chip select signal CS, the normal power down command PDM, and the deep sleep command DSM.

The semiconductor apparatus 100 in accordance with the present embodiment may operate in the normal power down mode according to the normal power down command PDM, and operate in the deep sleep mode (or deep power down mode) according to the deep sleep command DSM.

The deep sleep mode may have a longer power down interval (for example, 4 ms) than the normal power down mode.

The deep sleep mode and the normal power down mode may be set through specific bits of the command/address signal CA<0:N>.

For example, the deep sleep mode may be set according to the value of CA<5>, and the normal power down mode may be set according to the value of CA<6>.

When the normal power down command PDM is generated, the power control signal generation circuit 220 may generate the power gating control signal PDE at an active level (for example, high level), and generate the voltage control signal RPC at an inactive level (for example, low level).

When the deep sleep command DSM is generated, the power control signal generation circuit 220 may generate both of the power gating control signal PDE and the voltage control signal RPC at an active level, i.e. a high level.

With the semiconductor apparatus 100 in the deep sleep mode, an external device of the semiconductor apparatus 100, for example, the processor 30 of FIG. 1 may toggle the chip select signal CS once to command the semiconductor apparatus 100 to exit from the deep sleep mode. Thus, the semiconductor apparatus 100 may operate in the normal power down mode.

While the semiconductor apparatus 100 operates in the normal power down mode, the processor 30 may toggle the chip select signal CS to command the semiconductor apparatus 100 to exit from the normal power down mode.

When the chip select signal CS is toggled in a state where the semiconductor apparatus 100 has entered the deep sleep mode, the power control signal generation circuit 220 may recognize a deep sleep mode exit command DSX, retain the power gating control signal PDE at a high level, and change the voltage control signal RPC to a low level.

When the chip select signal CS is toggled in a state where the semiconductor apparatus 100 has entered the normal power down mode, the power control signal generation circuit 220 may recognize a normal power down mode exit command PDX, change the power gating control signal PDE to a low level, and retain the voltage control signal RPC at a low level.

The voltage divider circuit 230 may change a division ratio according to the voltage control signal RPC, and generate a divided voltage VDIV by distributing the pumping voltage VPP at the changed division ratio.

Under the condition that the pumping voltage VPP has a constant level, the divided voltage VDIV may have different levels as the division ratio is changed.

The voltage divider circuit 230 may include a first resistor Ra and a second resistor Rb which are coupled between a terminal of the pumping voltage VPP and a ground terminal.

The voltage of a node to which the first and second resistors Ra and Rb are coupled may be outputted as the divided voltage VDIV.

The first resistor Ra may be a variable resistor of which the resistance value is adjusted according to the voltage control signal RPC.

When the voltage control signal RPC is at a high level, the first resistor Ra may have a lower resistance value than when the voltage control signal RPC is at a low level. Therefore, the divided voltage VDIV may become higher in the deep sleep mode than in the normal power down mode.

The comparator 240 may generate a detection signal PP_DET by comparing a reference voltage VREFP to the divided voltage VDIV.

The reference voltage VREFP may have a level corresponding to a half of the first level of the pumping voltage VPP, for example.

The comparator 240 may output the detection signal PP_DET at a high level when the divided voltage VDIV is lower than the reference voltage VREFP (e.g., in the normal power down mode), and output the detection signal PP_DET at a low level when the divided voltage VDIV is higher than the reference voltage VREFP (e.g., in the deep sleep mode).

The oscillator 250 may generate an oscillation signal OSC_VPP according to the detection signal PP_DET.

The oscillator 250 may generate the oscillation signal OSC_VPP during an interval in which the detection signal PP_DET is at a high level (e.g., in the normal power down mode).

The pump 260 may generate the pumping voltage VPP according to the oscillation signal OSC_VPP.

The pump 260 may generate the pumping voltage VPP by performing a pumping operation using the supply voltage VDD according to pulses of the oscillation signal OSC_VPP.

The pumping voltage capacitor 270 may be charged through the pumping operation of the pump 260, and thus raise the level of the pumping voltage VPP in the normal power down mode. When the pumping operation of the pump 260 is stopped, the pumping voltage capacitor 270 may be discharged through the current path 280 and thus the level of the pumping voltage VPP may be lowered in the deep sleep mode.

Figure 3:
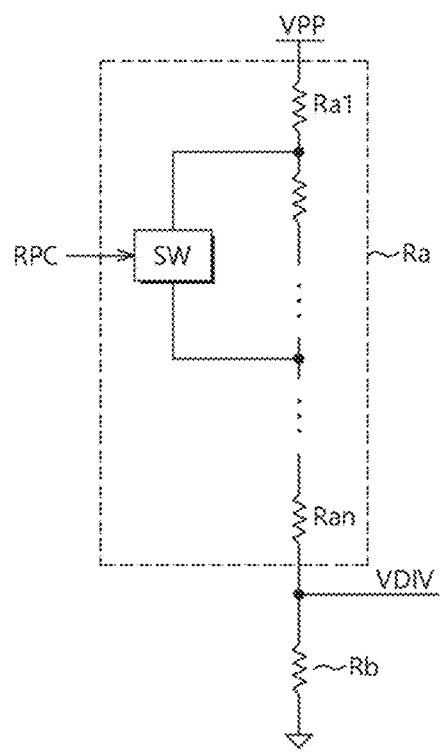
FIG. 3 is a diagram illustrating a configuration of a voltage divider circuit of FIG. 2.

FIG. 3 is a diagram illustrating a configuration of the voltage divider circuit 230 of FIG. 2.

Referring to FIG. 3, the first resistor Ra of the voltage divider circuit 230 may include a plurality of resistors Ra1 to Ran and a switch SW.

The switch SW may be coupled to any one node and another node among coupling nodes of the plurality of resistors Ra1 to Ran.

The switch SW may be turned on when the voltage control signal RPC is at a high level (e.g., in the deep sleep mode), and turned off when the voltage control signal RPC is at a low level (e.g., in the normal power down mode).

When the switch SW is turned off in the normal power down mode, the first resistor Ra may have a resistance value corresponding to the sum of resistance values of the plurality of resistors Ra1 to Ran.

On the other hand, when the switch SW is turned on in the deep sleep mode, the first resistor Ra may have a smaller resistance value than when the switch SW is turned off. Thus, the level of the divided voltage VDIV may rise.

Therefore, when the voltage control signal RPC is at a high level (i.e., in the deep sleep mode), the level of the pumping voltage VPP may become lower than when the voltage control signal RPC is at a low level.

Figure 4:
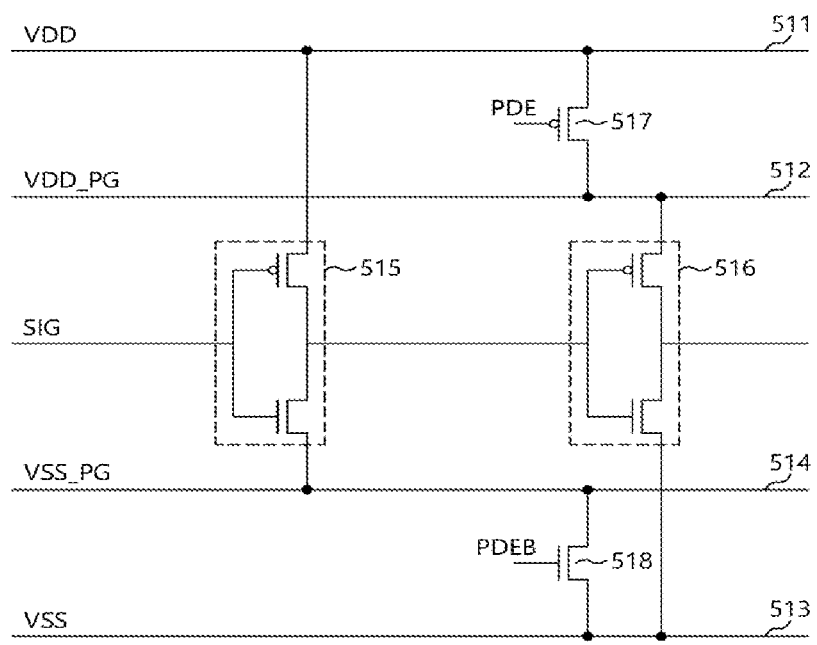
FIG. 4 is a diagram illustrating a configuration of a logic circuit block of FIG. 2.

FIG. 4 is a diagram illustrating a configuration of the logic circuit block of FIG. 2.

Referring to FIG. 4, the logic circuit block 510 may include first to fourth power lines 511 to 514, a plurality of logic gates 515 and 516 and power gating switches 517 and 518.

The logic circuit block 510 may include a plurality of logic gates in addition to the logic gates 515 and 516 illustrated in FIG. 4. For convenience of description, FIG. 4 illustrates only some of the logic gates.

Through the first power line 511, an external supply voltage, i.e. the first supply voltage VDD, may be applied to the logic gate 515.

The second power line 512 may be coupled to the first power line 511 through the power gating switch 517, and an internal voltage, i.e. a voltage applied through the first power line 511, may be applied as a second supply voltage VDD_PG to the logic gate 516.

Through the third power line 513, an external ground voltage, i.e. the first ground voltage VSS, may be applied to the logic gate 516.

The fourth power line 514 may be coupled to the third power line 513 through the power gating switch 518, and an internal voltage, i.e. a voltage applied through the third power line 513, may be applied as a second ground voltage VSS_PG to the logic gate 515.

Although not illustrated in FIG. 4, normal power, i.e. the first supply voltage VDD or/and the first ground voltage VSS, may be supplied to some logic gates.

When the semiconductor apparatus 100 operates in the normal power down mode or the deep sleep mode, the power gating control signal PDE may become a high level, and the inverted power gating control signal PDEB may become a low level. Thus, power supply to the logic gates 515 and 516 may be removed.

Figure 5:
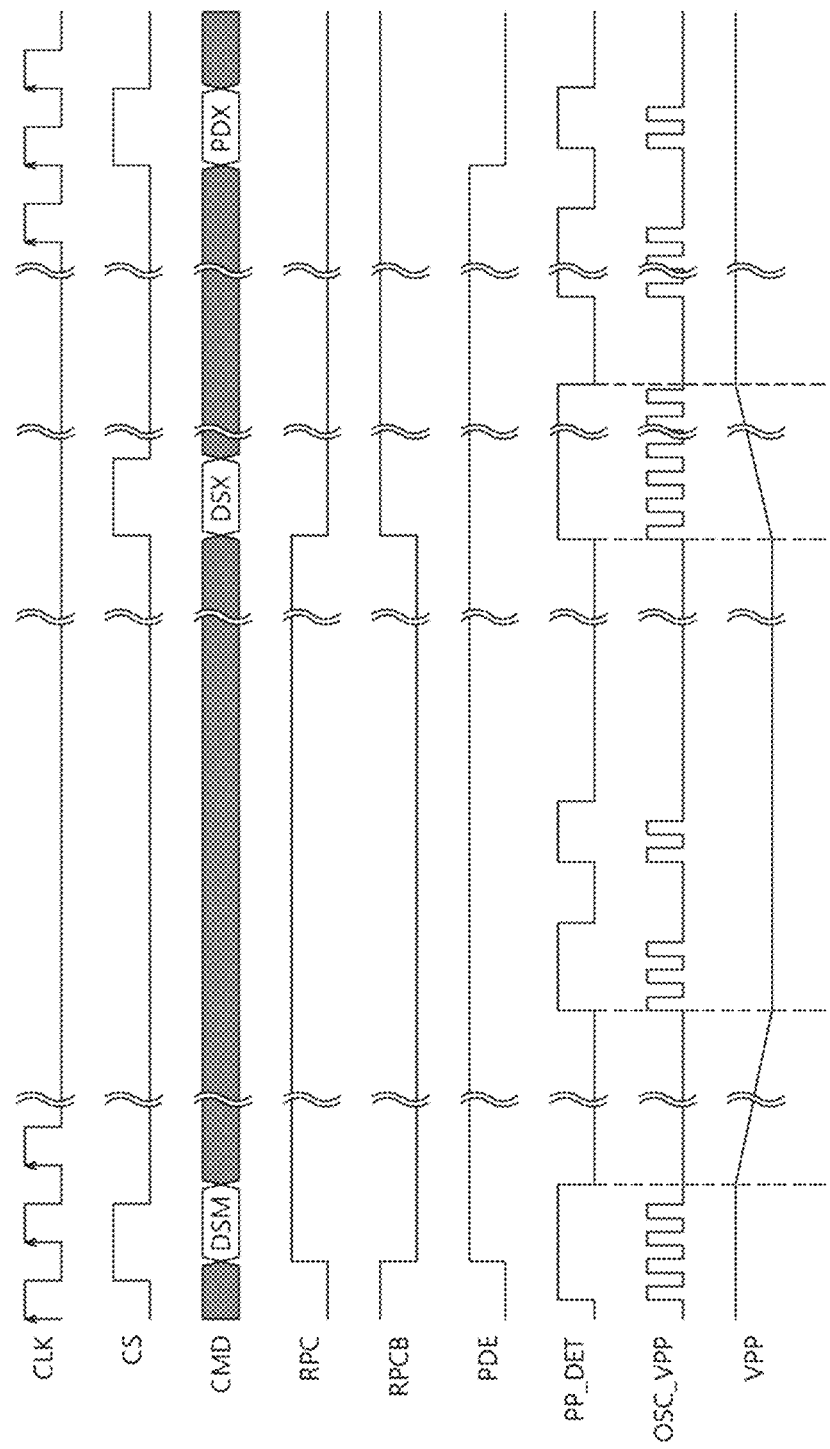
FIG. 5 is a timing diagram for describing an operation of the semiconductor apparatus in accordance with an embodiment.

FIG. 5 is a timing diagram for describing an operation of the semiconductor apparatus in accordance with the present embodiment.

Outside the semiconductor apparatus 100, the deep sleep command DSM may be generated through a combination of the chip select signal CS and the command/address signal CA<0:N>.

When the deep sleep command DSM is generated, the power control signal generation circuit 220 may generate both of the power gating control signal PDE and the voltage control signal RPC at a high level.

Since the power gating control signal PDE is at a high level, power supply to the logic circuit blocks 510 may be removed.

Since the voltage control signal RPC is at a high level, the value of the variable resistor Ra may decrease. Thus, the level of the divided voltage VDIV may rise.

When the level of the divided voltage VDIV becomes higher than the reference voltage VREFP, the detection signal PP_DET may transition to a low level.

Since the detection signal PP_DET is at a low level, the oscillator 250 may not operate. Thus, the level of the pumping voltage VPP may become lower than the first level.

Then, through a variation in level of the divided voltage VDIV according to the variation in the pumping voltage VPP, a transition in logic value of the detection signal PP_DET, generation of the oscillation signal OSC_VPP, and a connected operation of the pump 260, the level of the pumping voltage VPP may be retained at the second level lower than the first level.

Since the level of the pumping voltage VPP has been lowered, it is possible to reduce the power consumption by the operation using the pumping voltage VPP during the deep sleep mode interval, for example, the refresh operation.

When the chip select signal CS is toggled in the deep sleep mode, the power control signal generation circuit 220 may recognize the deep sleep mode exit command DSX, operate the semiconductor apparatus 100 in the normal power down mode, retain the power gating control signal PDE at a high level, and change the voltage control signal RPC to a low level.

Since the power gating control signal PDE retains a high level, the state in which power supply to the logic circuit blocks 510 is removed may be maintained.

Since the voltage control signal RPC is at a low level, the value of the variable resistor Ra may increase to the original value. Thus, the level of the divided voltage VDIV may fall.

When the level of the divided voltage VDIV becomes lower than the reference voltage VREFP, the detection signal PP_DET may transition to a high level.

Since the detection signal PP_DET is at a high level, the oscillator 250 may operate. Thus, the level of the pumping voltage VPP may rise up to the first level.

Then, through a variation in level of the divided voltage VDIV according to the variation in the pumping voltage VPP, a transition in logic value of the detection signal PP_DET, generation of the oscillation signal OSC_VPP, and a connected operation of the pump 260, the level of the pumping voltage VPP may be retained at the first level.

When the chip select signal CS is toggled again in a state where the semiconductor apparatus 100 has entered the normal power down mode, the power control signal generation circuit 220 may recognize the normal power down mode exit command PDX, change the power gating control signal PDE to a low level, and retain the voltage control signal RPC at a low level.

Since the power gating control signal PDE is at a low level, power supply to the logic circuit blocks 510 may be normally performed.

Figure 6:
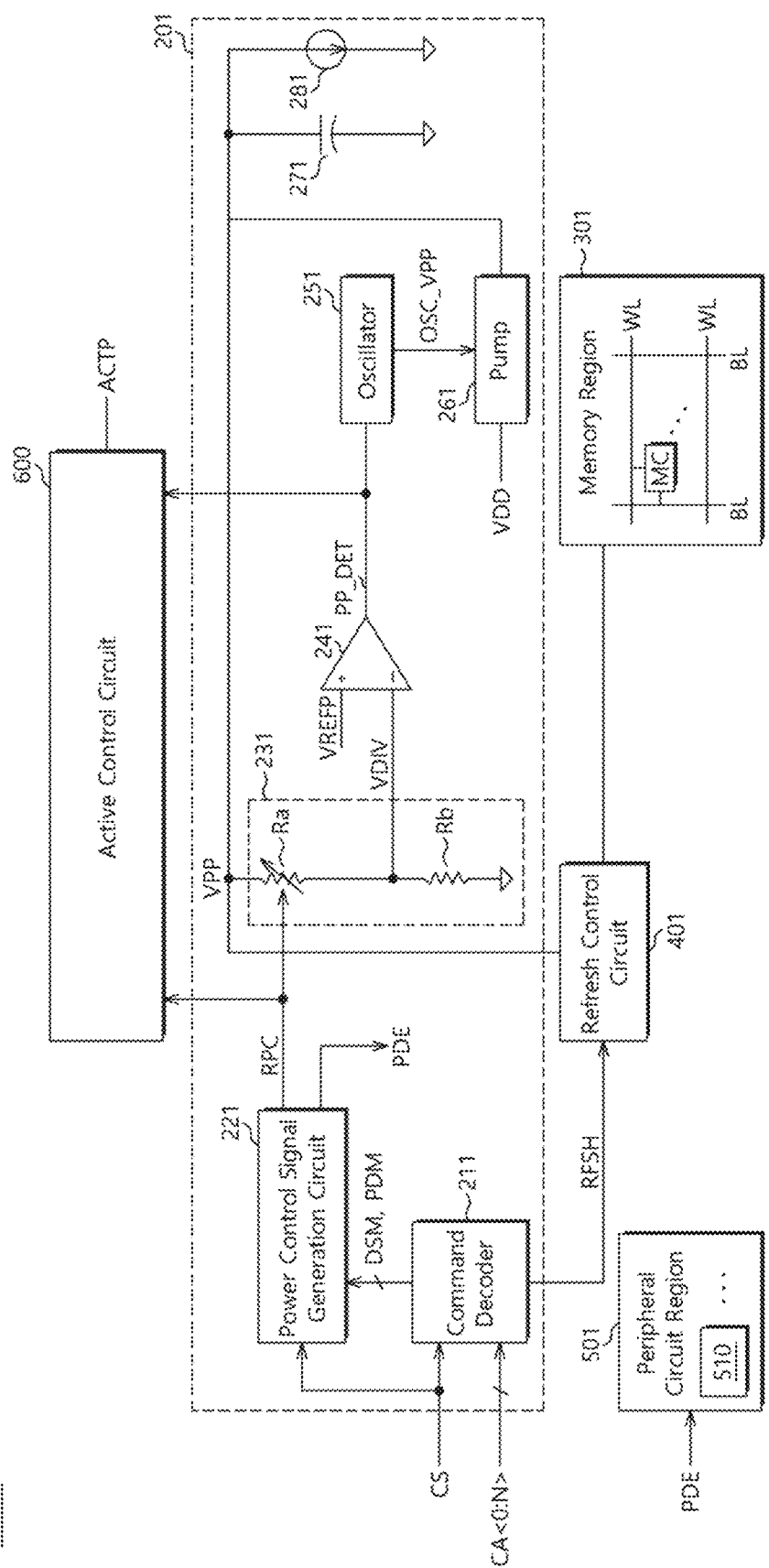
FIG. 6 is a diagram illustrating a configuration of a semiconductor apparatus in accordance with an embodiment.

FIG. 6 is a diagram illustrating a configuration of a semiconductor apparatus 101 in accordance with an embodiment.

The semiconductor apparatus 101 in accordance with the present embodiment may lower the level of an internal voltage, for example, a pumping voltage VPP used for a refresh operation during a deep sleep mode interval, thereby reducing power consumption.

The semiconductor apparatus 101 may lower the level of the pumping voltage VPP during the deep sleep mode interval, and increase an active operation interval, for example, a row active operation interval.

Referring to FIG. 6, the semiconductor apparatus 101 in accordance with the present embodiment may include a power control circuit 201, a memory region 301, a refresh control circuit 401, a peripheral circuit region 501 and an active control circuit 600.

The power control circuit 201, the memory region 301, the refresh control circuit 401, and the peripheral circuit region 501 may be configured in the same manner as FIG. 2.

The active control circuit 600 may be configured to activate an active control signal ACTP depending on a deep sleep mode interval.

The active control circuit 600 may be configured to activate the active control signal ACTP as the semiconductor apparatus 101 enters the deep sleep mode interval, and deactivate the active control signal ACTP when detecting that the pumping voltage VPP rises up to the first level after the semiconductor apparatus 101 exits from the deep sleep mode interval.

The active control signal ACTP may be provided to the memory region 301, and the memory region 301 may perform an active operation, i.e. a row active operation according to the active control signal ACTP.

The active control circuit 600 may generate the active control signal ACTP according to a voltage control signal RPC and a detection signal PP_DET.

The active control circuit 600 may change the active control signal ACTP to an active level (for example, high level) according to the voltage control signal RPC, and change the active control signal ACTP to an inactive level (for example, low level) according to the detection signal PP_DET and the voltage control signal RPC.

In accordance with the present embodiment, the semiconductor apparatus 101 may increase tRAS (Row Active to Precharge) while lowering the level of the pumping voltage VPP during the deep sleep mode interval, such that the refresh operation can be stably performed through the low-level pumping voltage VPP.

The increase of tRAS may be performed by increasing the active interval of the active control signal ACTP. The increase of the active interval of the active control signal ACTP may cause longer active operation interval of the memory region 300.

Figure 7:
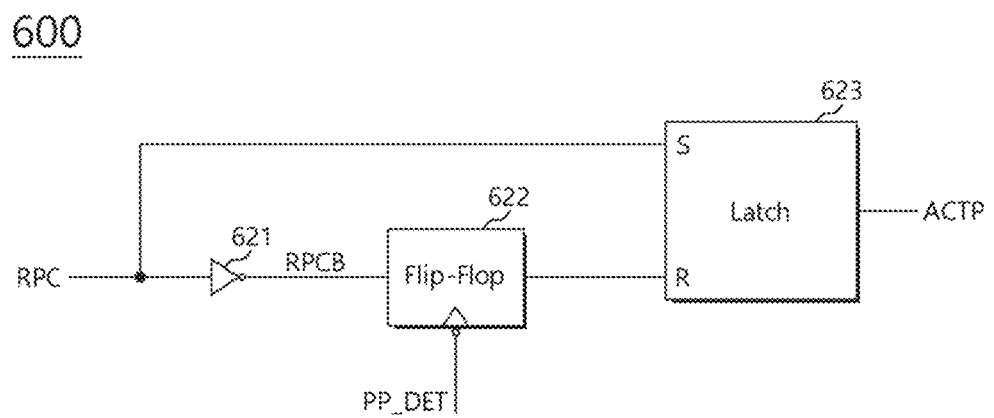
FIG. 7 is a diagram illustrating a configuration of an active control circuit of FIG. 6.

FIG. 7 is a diagram illustrating a configuration of the active control circuit 600 of FIG. 6.

Referring to FIG. 7, the active control circuit 600 may include an inverter 621, a flip-flop 622 and a latch 623.

The inverter 621 may invert the voltage control signal RPC, and output the inverted voltage control signal RPCB.

The flip-flop 622 may latch the inverted voltage control signal RPCB according to a falling edge of the detection signal PP_DET.

The latch 623 may activate the active control signal ACTP to a high level according to the voltage control signal RPC inputted through a set terminal S, and deactivate the active control signal ACTP to a low level according to an output signal of the flip-flop 622, inputted through a reset terminal R.

Figure 8:
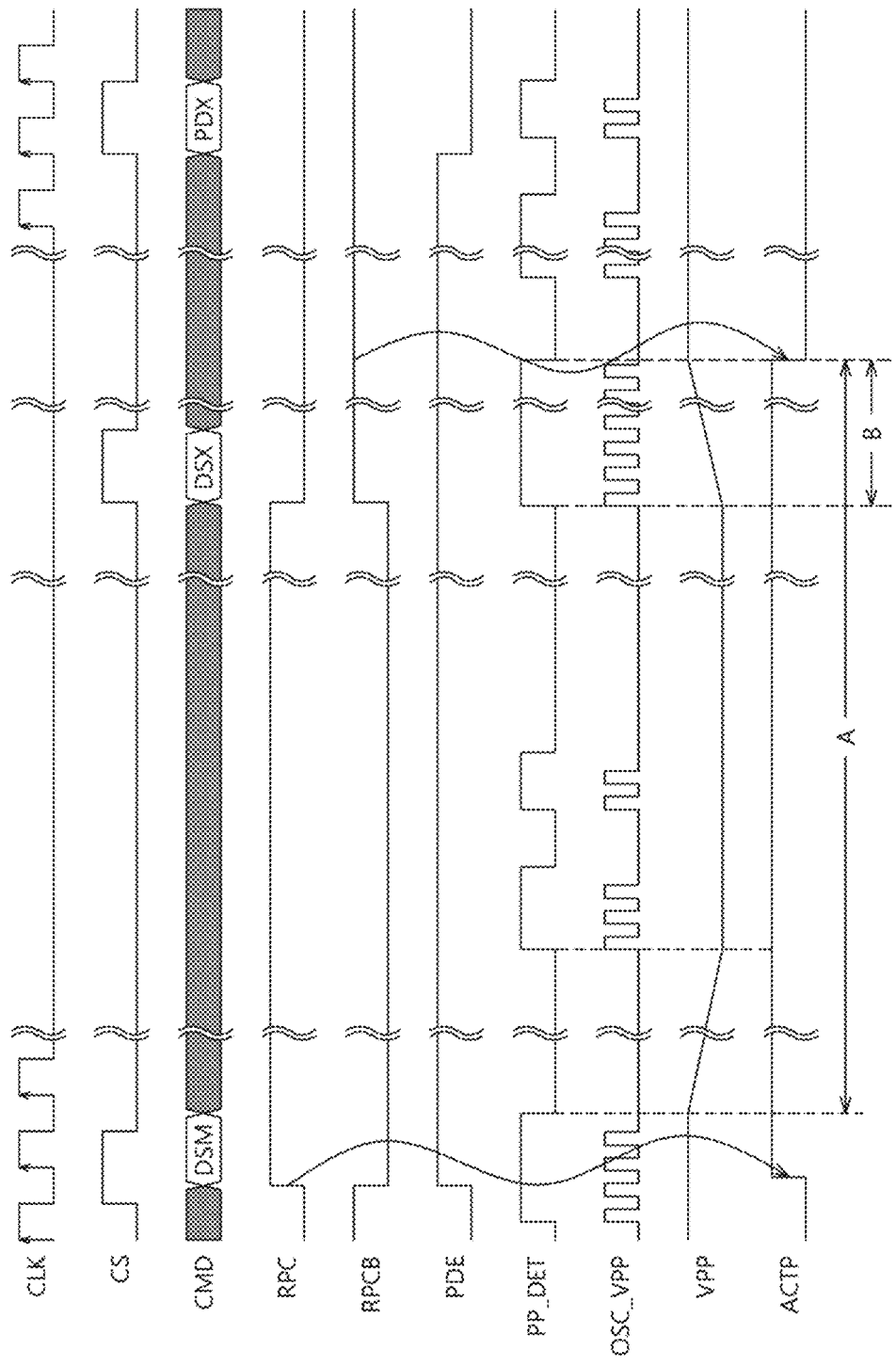
FIG. 8 is a timing diagram for describing an operation of the semiconductor apparatus in accordance with an embodiment.

FIG. 8 is a timing diagram for describing an operation of the semiconductor apparatus in accordance with the present embodiment.

Outside the semiconductor apparatus 101, the deep sleep command DSM may be generated through a combination of the chip select signal CS and the command/address signal CA<0:N>.

When the deep sleep command DSM is generated, a power control signal generation circuit 221 may generate both of the power gating control signal PDE and the voltage control signal RPC at a high level.

As the voltage control signal RPC transitions to a high level, the active control circuit 600 may change the active control signal ACTP to a high level.

Since the power gating control signal PDE is at a high level, power supply to the logic circuit blocks 510 may be removed.

Since the voltage control signal RPC is at a high level, the value of the variable resistor Ra may decrease. Thus, the level of the divided voltage VDIV may rise.

When the level of the divided voltage VDIV becomes higher than the reference voltage VREFP, the detection signal PP_DET may transition to a low level.

Since the detection signal PP_DET is at a low level, an oscillator 251 may not operate. Thus, the level of the pumping voltage VPP may become lower than the first level.

Then, through a variation in level of the divided voltage VDIV according to the variation in the pumping voltage VPP, a transition in logic value of the detection signal PP_DET, generation of the oscillation signal OSC_VPP, and a connected operation of a pump 261, the level of the pumping voltage VPP may be retained at the second level lower than the first level.

Since the level of the pumping voltage VPP has been lowered, it is possible to reduce power consumption by the operation using the pumping voltage VPP during the deep sleep mode interval, for example, the refresh operation.

When the chip select signal CS is toggled in the deep sleep mode, the power control signal generation circuit 221 may recognize the deep sleep mode exit command DSX, operate the semiconductor apparatus 101 in the normal power down mode, retain the power gating control signal PDE at a high level, and change the voltage control signal RPC to a low level.

Since the power gating control signal PDE retains a high level, the state in which power supply to the logic circuit blocks 510 is removed may be maintained.

Since the voltage control signal RPC is at a low level, the value of the variable resistor Ra may increase to the original value. Thus, the level of the divided voltage VDIV may fall.

When the level of the divided voltage VDIV becomes lower than the reference voltage VREFP, the detection signal PP_DET may transition to a high level.

Since the detection signal PP_DET is at a high level, the oscillator 251 may operate. Thus, the level of the pumping voltage VPP may rise to the first level.

Then, through a variation in level of the divided voltage VDIV according to the variation in the pumping voltage VPP, a transition in logic value of the detection signal PP_DET, generation of the oscillation signal OSC_VPP, and a connected operation of the pump 261, the level of the pumping voltage VPP may be retained at the first level.

When the detection signal PP_DET transitions to a low level after the voltage control signal RPC transitions to a high level, the active control circuit 600 may deactivate the activate control signal ACTP to a low level.

The voltage control signal RPC has transitioned to a high level such that the semiconductor apparatus 101 exits from the deep sleep mode. However, the pumping voltage VPP is still rising from the second level but has not yet reached the first level right after the semiconductor apparatus 101 exits from the deep sleep mode.

Therefore, although the voltage control signal RPC transitions to a high level, the deactivation of the active control signal ACTP may be delayed until the timing at which it can be defined that the pumping voltage VPP was stabilized to the first level, that is, the timing at which the detection signal PP_DET transitions to a low level. The delayed deactivation of the active control signal ACTP may guarantee the first level of the pumping voltage VPP and thus may secure the stability of the refresh operation to be performed according to the recovered (i.e., shortened-back) tRAS and the guaranteed first level of the pumping voltage VPP in the normal power down mode coming back from the deep sleep mode.

When the chip select signal CS is toggled again in a state where the semiconductor apparatus 101 entered the normal power down mode, the power control signal generation circuit 221 may recognize the normal power down mode exit command PDX, change the power gating control signal PDE to a low level, and retain the voltage control signal RPC at a low level.

Since the power gating control signal PDE is at a low level, power supply to the logic circuit blocks 510 may be normally performed.

The delayed interval (B) of the active control signal ACTP is very short in comparison with the interval (A) in which the level of the pumping voltage VPP is lowered. Thus, a power increasing due to the delayed interval (B) has little effect on the reducing power consumption by the interval (A).

Figure 9:
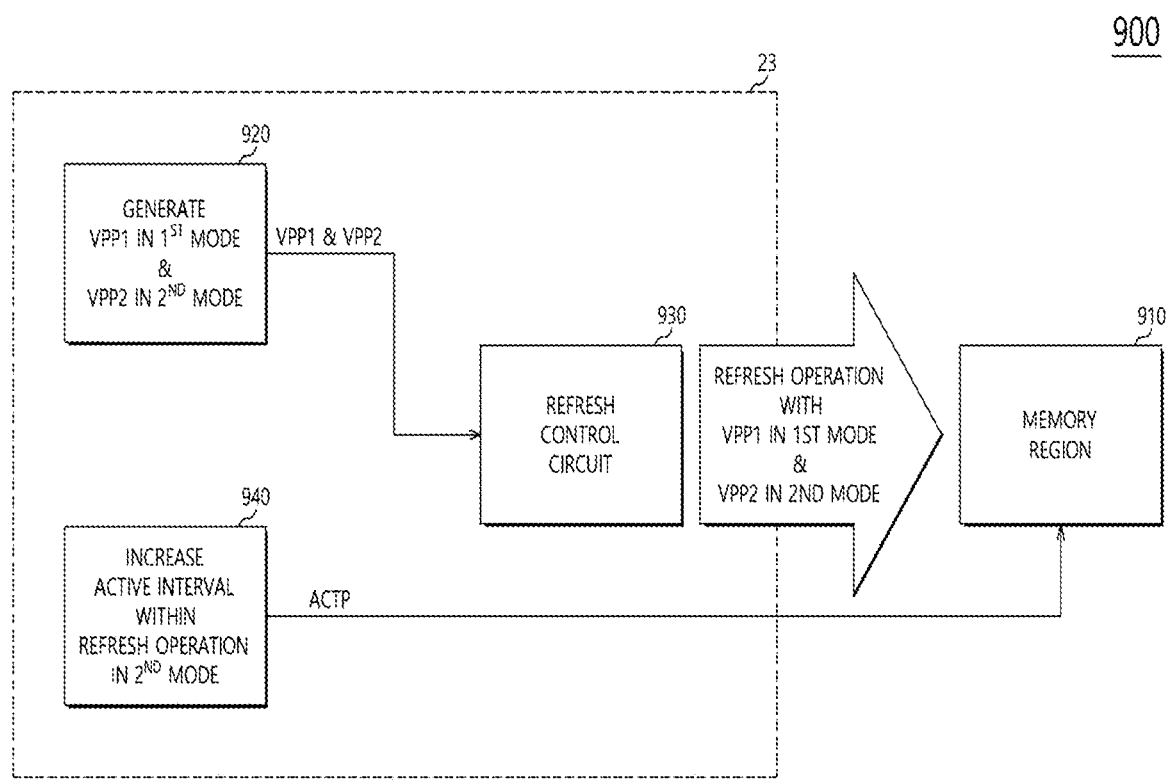
FIG. 9 is a diagram illustrating a configuration of a semiconductor apparatus 900 in accordance with an embodiment.

FIG. 9 is a diagram illustrating a configuration of a semiconductor apparatus 900 in accordance with an embodiment.

The semiconductor apparatus 900 may include the control circuit 23 and a memory region 910.

The memory region 910 may correspond to the memory region 300 of FIG. 2 or the memory region 301 of FIG. 6 but will not be limited thereto.

The control circuit 23 may include a power control circuit 920, a refresh control circuit 930 and an active control circuit 940.

The power control circuit 920 may generate a first pumping voltage VPP1 in a first mode and a second pumping voltage VPP2 in a second mode. In an embodiment, the first mode may be a normal power down mode and the second mode may be the deep sleep mode but will not be limited thereto. In an embodiment, the first pumping voltage VPP1 may be the pumping voltage VPP of the first level and the second pumping voltage VPP2 may be the pumping voltage VPP of the second level but will not be limited thereto. In an embodiment, the power control circuit 920 may correspond to the power control circuit 200 of FIG. 2 and the power control circuit 201 of FIG. 6 but will not be limited thereto.

The refresh control circuit 930 may perform a refresh operation to the memory region 910. The refresh control circuit 930 may perform the refresh operation according to the first pumping voltage VPP1 in the first mode and according to the second pumping voltage VPP2 in the second mode. The refresh control circuit 930 may correspond to the refresh control circuit 400 of FIG. 2 and the refresh control circuit 401 of FIG. 6 but will not be limited thereto.

The active control circuit 940 may increase the active operation interval within the refresh operation in the second mode by enabling the active control signal ACTP at the start of the second mode and disabling the active control signal ACTP a predetermined time after the end of the second mode. The enabled active control signal ACTP may be provided to the memory region 910, and the memory region 910 may perform the active operation, i.e., the row active operation according to the enabled active control signal ACTP. The delayed disablement of the active control signal ACTP may guarantee the recovery from the second pumping voltage VPP2 to the first pumping voltage VPP1 and thus may secure the stability of the refresh operation to be performed according to the recovered (i.e., shortened-back) tRAS and the guaranteed first pumping voltage VPP1 in the first mode coming back from the second mode. In an embodiment, the predetermined time may be defined through a heuristic approach for the complete recovery from the second pumping voltage VPP2 to the first pumping voltage VPP1. In embodiment, the predetermined time may be defined by the combination of the detection signal PP_DET and the voltage control signal RPC as described with reference to FIGS. 6 to 8.

In accordance with the present embodiments, it is possible to reduce power consumption while guaranteeing a stable operation of the semiconductor apparatus.

While various embodiments have been described above, it will be understood to those skilled in the art that the embodiments described are examples only. Accordingly, the power control circuit, the semiconductor apparatus including the same, and the power control method thereof, which are described herein, should not be limited based on the described embodiments.

While the disclosure illustrates and describes specific embodiments, it will be apparent to those skilled in the art in light of the present disclosure that various changes and modifications may be made without departing from the spirit and scope of the invention as defined in the following claims.

What is claimed is:

1. A power control circuit comprising:
    a command decoder configured to generate a normal power down command and a deep sleep command by decoding a chip select signal and a command/address signal;
    a power control signal generation circuit configured to generate a power gating control signal and a voltage control signal according to the chip select signal, the normal power down command, and the deep sleep command for setting a deep sleep mode;
    a voltage divider circuit having a division ratio that is changed according to the voltage control signal, and configured to generate a divided voltage by dividing an internal voltage at the changed division ratio;
    a comparator configured to generate a detection signal by comparing a reference voltage to the divided voltage;
    an oscillator configured to generate an oscillation signal according to the detection signal; and
    a pump configured to generate the internal voltage according to the oscillation signal.

2. The power control circuit according to claim 1,
    wherein the deep sleep mode has a longer power down interval than a normal power down mode based on the normal power down command, and
    wherein the deep sleep mode and the normal power down mode are set according to specific bits of the command/address signal.

3. The power control circuit according to claim 1, wherein the internal voltage is a voltage used for a refresh operation of a semiconductor apparatus.

4. The power control circuit according to claim 1, wherein when a semiconductor apparatus operates in the deep sleep mode, the voltage divider circuit changes the division ratio to raise the level of the divided voltage according to the voltage control signal.

5. A semiconductor apparatus comprising:
    a memory region;
    a refresh control circuit configured to perform a refresh operation on the memory region according to a refresh command;
    a power control circuit configured to adjust a level of an internal voltage to a second level during a deep sleep mode interval, the second level being lower than a first level which is set for operation intervals other than the deep sleep mode interval; and
    an active control circuit configured to generate an active control signal for controlling an active operation of the memory region within the deep sleep mode interval, wherein the refresh control circuit is configured to perform the refresh operation during the deep sleep mode.

6. The semiconductor apparatus according to claim 5, wherein the active control circuit activates the active control signal when the semiconductor apparatus enters the deep sleep mode interval, and deactivates the active control signal when detecting that the internal voltage rises up to the first level after the semiconductor apparatus exits from the deep sleep mode interval.

7. The semiconductor apparatus according to claim 5, wherein the power control circuit activates a power gating control signal during a normal power down mode interval and the deep sleep mode interval.

8. The semiconductor apparatus according to claim 7,
wherein the deep sleep mode has a longer power down interval than the normal power down mode, and
wherein the deep sleep mode and the normal power down mode are set according to specific bits of a command/address signal.

9. The semiconductor apparatus according to claim 7,
further comprising logic circuit blocks,
wherein power supply to one or more logic gates of the logic circuit blocks is blocked according to the power gating control signal.

10. The semiconductor apparatus of claim 5, wherein the power control circuit comprises:
a command decoder configured to generate a normal power down command and a deep sleep command by decoding a chip select signal and a command/address signal;
a power control signal generation circuit configured to generate a power gating control signal and a voltage control signal according to the chip select signal, the normal power down command and the deep sleep command for setting the deep sleep mode;
a voltage divider circuit having a division ratio that is changed according to the voltage control signal, and configured to generate a divided voltage by dividing an internal voltage at the changed division ratio;
a comparator configured to generate a detection signal by comparing a reference voltage to the divided voltage;
an oscillator configured to generate an oscillation signal according to the detection signal; and
a pump configured to generate the internal voltage according to the oscillation signal.

11. The semiconductor apparatus according to claim 10, wherein when the semiconductor apparatus operates in the deep sleep mode, the voltage divider circuit raises the level of the divided voltage according to the voltage control signal.

12. A power control method of a semiconductor apparatus, comprising:
generating an internal voltage of a first level when the semiconductor apparatus enters a normal power down mode;
generating the internal voltage of a second level lower than the first level when the semiconductor apparatus enters a deep sleep mode;
performing a refresh operation according to the internal voltage of the second level in the deep sleep mode; and
raising the level of the internal voltage to the first level from the second level when the semiconductor apparatus exits from the deep sleep mode.

13. The power control method according to claim 12, further comprising setting an active operation interval of the semiconductor apparatus to a time interval from the point of time that the semiconductor apparatus enters the deep sleep mode to the point of time that the level of the internal voltage rises to the first level.

14. The power control method according to claim 12, further comprising blocking a power supply to one or more of logic gates of the semiconductor apparatus until the semiconductor apparatus exits from the normal power down mode from the point of time that the semiconductor apparatus enters the normal power down mode or the point of time that the semiconductor apparatus enters the deep sleep mode.

15. The power control method according to claim 12,
wherein the deep sleep mode has a longer power down interval than the normal power down mode, and
wherein the deep sleep mode and the normal power down mode are set according to specific bits of a command/address signal.

16. A control circuit comprising:
a power control circuit configured to generate a first voltage in a first mode and a second voltage lower than the first voltage in a second mode;
a refresh control circuit configured to control a memory device to perform a refresh operation based on the first and second voltages in the first and second modes, respectively; and
an active control circuit configured to increase an active operation interval within the refresh operation in the second mode.

* * * * *